US006178625B1

(12) United States Patent
Watson et al.

(10) Patent No.: US 6,178,625 B1
(45) Date of Patent: Jan. 30, 2001

(54) METHOD FOR ASSEMBLING A WAREWASHER ASSEMBLY

(75) Inventors: Michael T. Watson, Centerville; Flavil M. Pollock, Piqua, both of OH (US)

(73) Assignee: Premark FEG L.L.C., Wilmington, DE (US)

( * ) Notice: Under 35 U.S.C. 154(b), the term of this patent shall be extended for 0 days.

(21) Appl. No.: 09/148,372

(22) Filed: Sep. 4, 1998

Related U.S. Application Data

(60) Provisional application No. 60/058,088, filed on Sep. 5, 1997.

(51) Int. Cl.[7] ....................... H05K 3/30

(52) U.S. Cl. ....................... 29/832; 29/842; 29/857; 29/825; 312/265.2; 312/265.3; 312/280; 312/326; 312/329; 361/610; 361/622; 361/625; 361/641; 206/320; 206/325

(58) Field of Search ....................... 29/842, 825, 845, 29/857, 832; 206/320, 325; 53/472; 361/610, 622, 625, 641; 312/265.2, 265.3, 223.1, 280, 326, 329, 311

(56) References Cited

U.S. PATENT DOCUMENTS 4,317,516 * 3/1982 Palmer-Ball, Sr. .................. 206/320

* cited by examiner

*Primary Examiner*—Lee Young
*Assistant Examiner*—Rick Kiltae Chang
(74) *Attorney, Agent, or Firm*—Thompson Hine & Flory LLP

(57) ABSTRACT

A longitudinal warewasher section, of a warewasher assembly having a plurality of warewasher sections mounted end-to-end, includes a frame and a control box pivotally mounted thereto, where the control box is pivotable from a compact, shipping orientation to an installation or operating orientation. The control box preferably includes electrical controls that have been pre-wired to the electrical and/or mechanical components of the warewasher section. When in the shipping position, the rear face of the control box lies substantially flush against a lateral end of the frame and the side face of the control box is substantially flush with the longitudinal front wall of the frame such that the control box faces outwardly from the lateral end of the frame. In this orientation, the control box does not add to the total lateral width of the warewasher section. After the warewasher section has been shipped and unloaded, the control box is pivoted substantially 90° about hinges to an operating orientation, in which the rear face of the control box is perpendicular to the lateral end of the frame and the control box faces outwardly from the longitudinal front side of the frame. Once the control box is pivoted to this orientation, the end-to-end connection of the remaining warewasher sections to the present section may then continue.

5 Claims, 5 Drawing Sheets

METHOD FOR ASSEMBLING A WAREWASHER ASSEMBLY

CROSS REFERENCE TO RELATED APPLICATIONS

The present invention claims priority under 35 U.S.C. §119 from Provisional Pat. App. Ser. No. 60/058,088, filed Sep. 5, 1997.

BACKGROUND OF THE INVENTION

The present invention is directed towards a warewasher section having a control box for receiving electrical controls, and more particularly, to a warewasher section having a control box for receiving pre-wired electrical controls which is pivotable from an operating position to a compact, shipping position.

Commercial warewashers typically include a longitudinally extending housing having a series of wash stations located therein. An outer casing defines the generally rectangular inner chamber, and a conveyer is located inside the compartment to transport the ware through the various stations. For shipping and servicing purposes, the washer is typically constructed from a series of individual, modular sections that may be connected together longitudinally, end-to-end to form the warewasher unit.

Commercial warewashers must carry out and coordinate a variety of functions at any one time. For example, the inflow and drainage of water, heating of the water, mixing and spraying of the fluids, control of the conveyor, and the control of gauges and sensors need all be overseen. Accordingly, the washer sections include a series electrical and/or mechanical components for performing such functions, the electronic controls of which are typically contained within a single control box. When the warewasher is fully assembled, the control box is located on an outside wall of the warewasher, and preferably, is located along a longitudinal front wall of the warewasher.

It is advantageous to complete the wiring between the electronic controls within the control box and the electronic and/or mechanical components of the warewasher section at the factory prior to shipping the warewasher section. This enables the supplier to ship an entire pre-wired warewasher section and control box assembly to the customer, thus allowing for easy and rapid installation of the warewasher at the customer's facility. However, due to the large number of electrical controls, the control box may become quite bulky and large. Furthermore, because the control box is preferably mounted to the longitudinal front wall of the finally assembled warewasher, the lateral width of the washer section that includes the control box will be increased, making it difficult to fit the washer section through doorways or into shipping crates during shipping.

Accordingly, there exists a need for a pre-wired warewasher section and control box assembly that facilitates relatively easy and convenient shipping and installation.

SUMMARY OF THE INVENTION

The present invention is a warewasher section that includes a frame and a control box pivotally mounted thereto, where the control box is pivotable from a compact, shipping orientation to an installation or operating orientation. The control box preferably includes electrical controls that have been pre-wired to the electrical and/or mechanical components of the warewasher section. When in the shipping position, the rear face of the control box lies substantially flush against a lateral end of the frame and the side face of the control box is substantially flush with the longitudinal front wall of the frame such that the control box faces outwardly from the lateral end of the frame. In this orientation, the control box does not add to the total lateral width of the warewasher section. After the warewasher section has been shipped and unloaded, the control box is pivoted substantially 90° about hinges to an operating orientation, in which the rear face of the control box is perpendicular to the lateral end of the frame and the control box faces outwardly from the longitudinal front side of the frame. Once the control box is pivoted to this orientation, the end-to-end connection of the remaining warewasher sections to the present section may then continue.

Preferably, the control box is mounted to hinges positioned on a corner of the frame of the warewasher section where the longitudinal front wall and the lateral end face intersect. Further, the warewasher section includes a removable strut spanning the lateral end of the frame, between the longitudinal front and rear walls of the frame. The strut provides structural support for the frame during shipment and also preferably provides a mount for the control box when the control box is in the shipping position. Once the control box is released from the strut and pivoted to its operating position, the strut is easily removed from the frame. Additionally, upon mounting a second warewasher section end-to-end to the lateral end of the warewasher section, the hinges may also be easily removed.

Accordingly, it is an object of the present invention to provide a warewasher section and pre-wired control box assembly that allows the warewasher section to be shipped to the customer with all of its mechanical and/or electrical components pre-wired to the electrical controls in the control box, yet where the control box does not add to the lateral width of the warewasher section during shipping. It is another object of the present invention to provide a warewasher section and control box assembly that, once unpacked, allows the control box to be easily pivoted to its installation or operating position. With the assistance of a floor jack, pivoting of the control box to the operating position and securing the control box in this position can be accomplished by a single worker.

These and other objects and advantages of the present invention will be more fully understood and appreciated by reference to the following description, the accompanying drawings and the appended claims.

DETAILED DESCRIPTION

Figure 1:
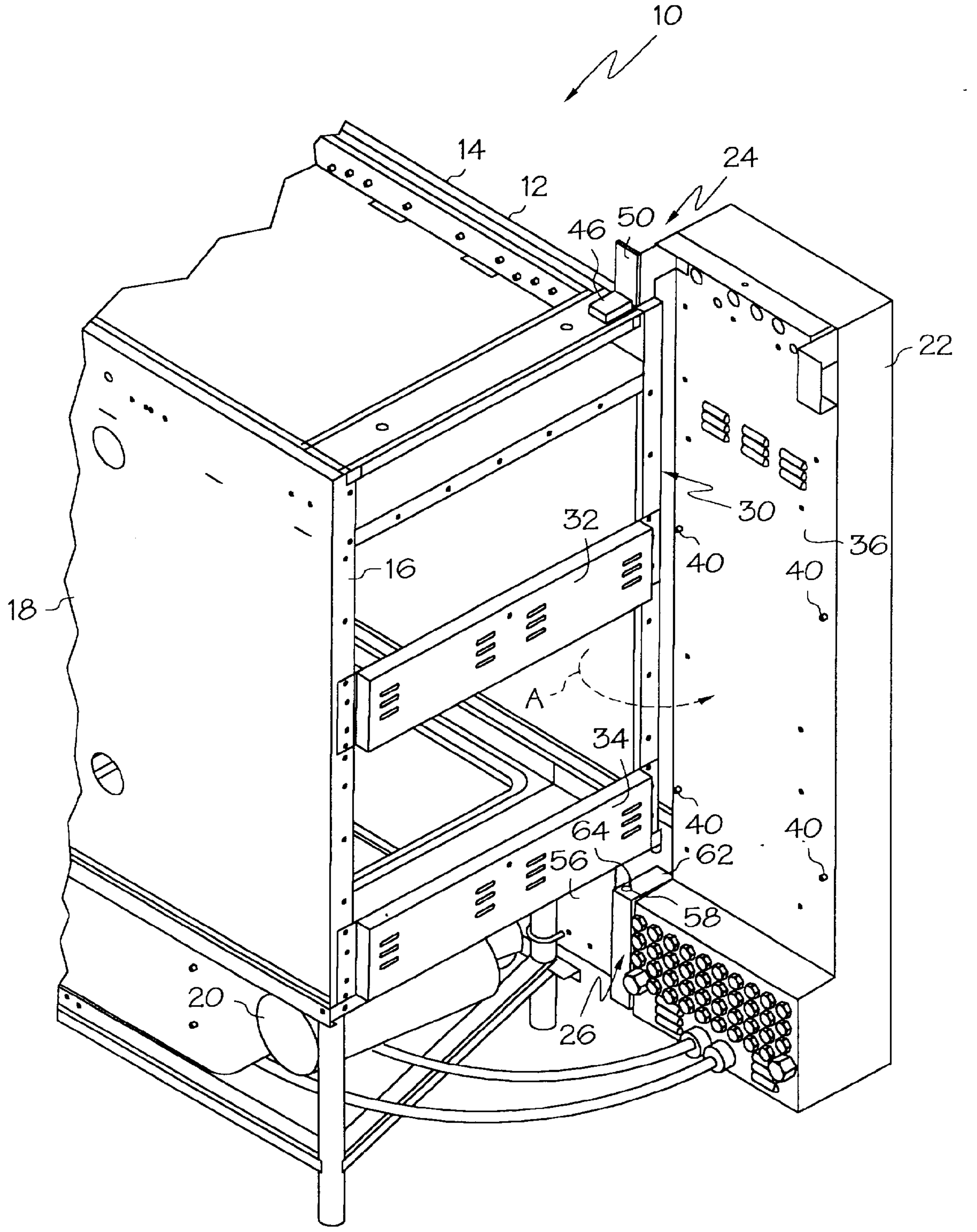
FIG. 1 is a perspective view of a warewasher section frame and control box assembly according to the present invention, taken from the lateral end and rear of the warewasher section, where the control box is positioned in its operating orientation.

As shown in FIGS. 1–4, the warewasher section 10 of the present invention includes a frame 12 having a longitudinal front wall 14, a lateral end 16 and a longitudinal rear wall 18, where the lateral end is adapted to be connected end-to-end with another warewasher section. The warewasher section 10, in the illustrated embodiment is a center section of a conveyer-type warewasher, and includes various electrical and/or mechanical components, such as tanks, pumps and heaters. For the purposes of clarity, only the pump 20 is shown. A control box 22 is pivotally mounted to the frame 12 by an upper hinge 24 and a lower hinge 26. The control box 22 is designed to house a plurality of electronic controls 28 which are pre-wired to the various electrical and/or mechanical components of the warewasher section 10, so that the control box provides a central control for the various electrical and/or mechanical components.

The hinges 24, 26 are located so as to not interfere with the attachment of the second warewasher section, discussed below; and preferably, are mounted on the corner 30 of the frame where the longitudinal front wall 14 and the lateral end 16 of the frame intersect, respectively to top and bottom faces of the frame. Alternatively, the hinges 24, 26 may also be located on the side of the frame 12.

Figure 3:
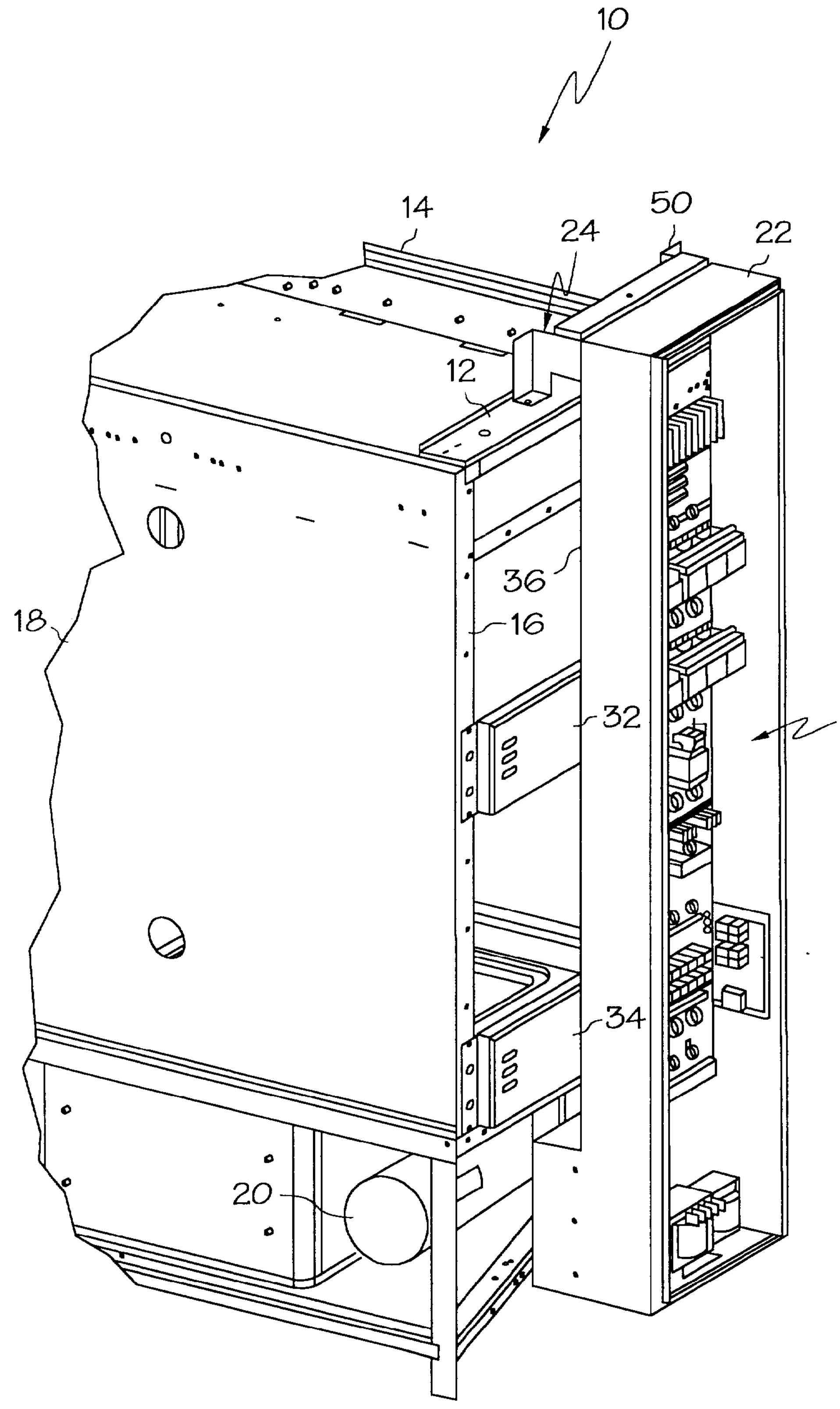
FIG. 3 is a perspective view of a warewasher section frame and control box assembly according to the present invention, taken from the lateral end and rear of the warewasher section, where the control box is positioned in its shipping orientation.
Figure 4:
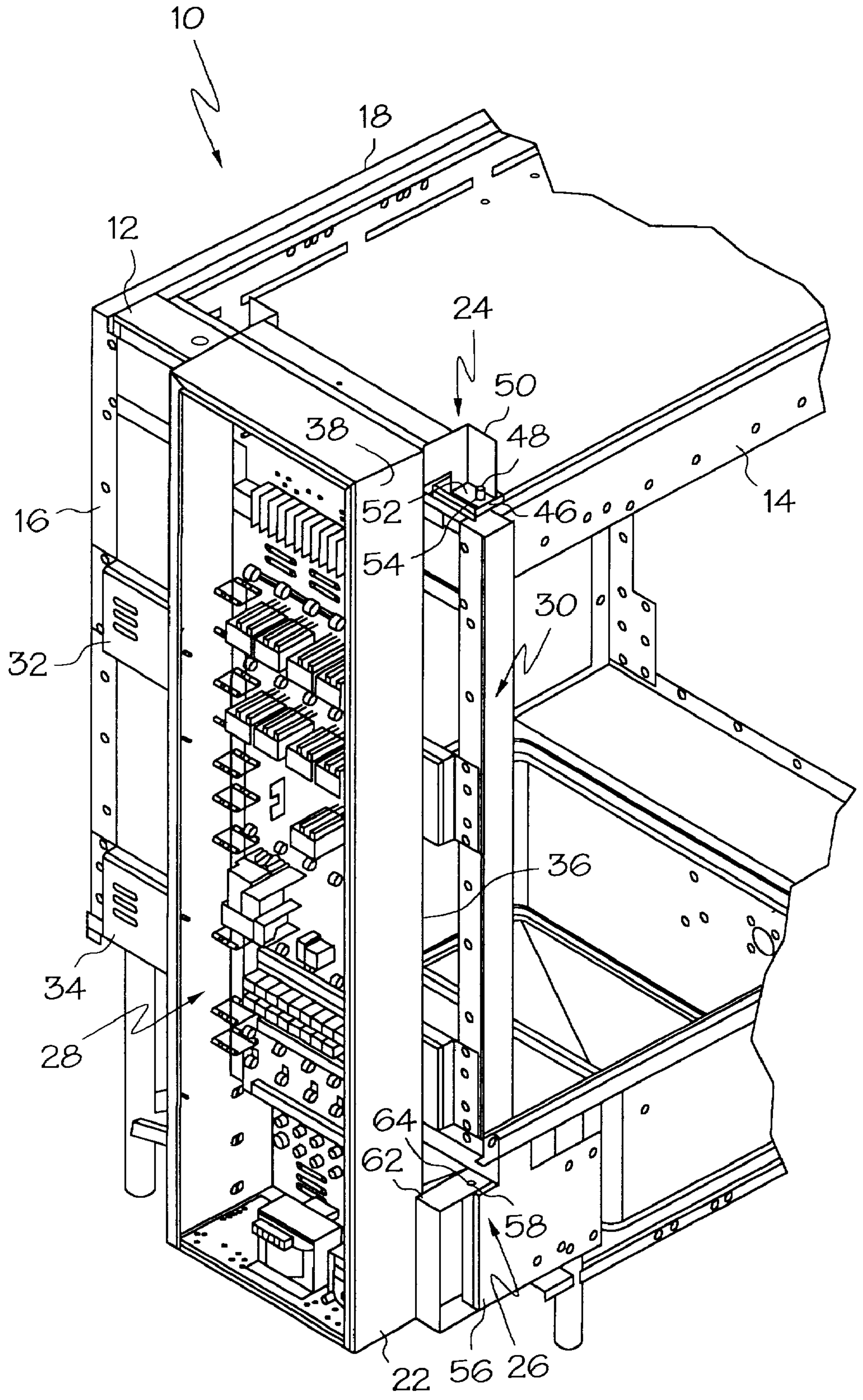
FIG. 4 is a perspective view of the warewasher section frame and control box assembly of FIG. 1, taken from front of the warewasher section, where the control box is positioned in its shipping orientation.
Figure 5:
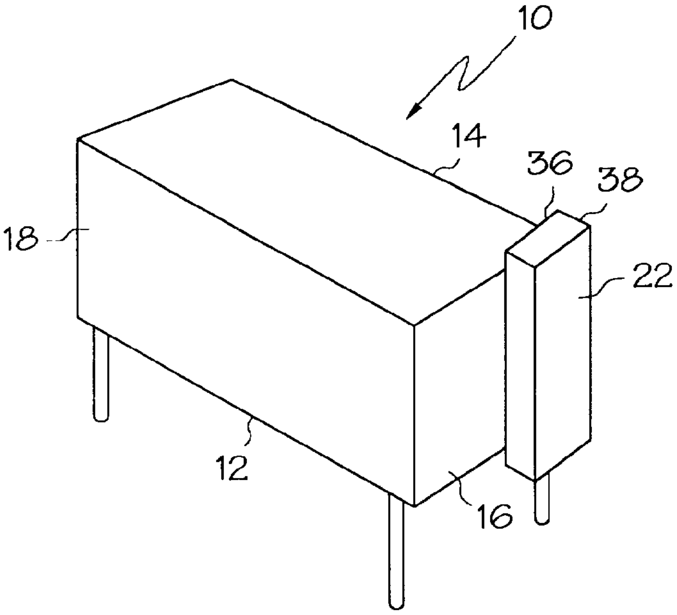
FIG. 5 is a simplified perspective view of the warewasher section and control box assembly, where the control box is positioned in its shipping orientation.

A pair of struts 32, 34 span horizontally along the lateral end 16 of the frame 12 between longitudinal front and rear walls 14, 18 and provide a mount for the control box 22 when positioned in the shipping orientation (see FIGS. 3–5) and also provide structural support for the frame 12 during shipping. As shown in FIGS. 3–5, when in the shipping orientation, the rear face 36 of the control box 22 is adjacent to the lateral end 16 of the frame 12 and the lateral side face 38 of the control box is flush with the longitudinal front wall 14. In this orientation, the control box 22 does not add to the total lateral width of the warewasher section; and accordingly, this orientation allows for easier shipping, and also allows the warewasher section to pass through narrower openings than would otherwise be possible.

Figure 2:
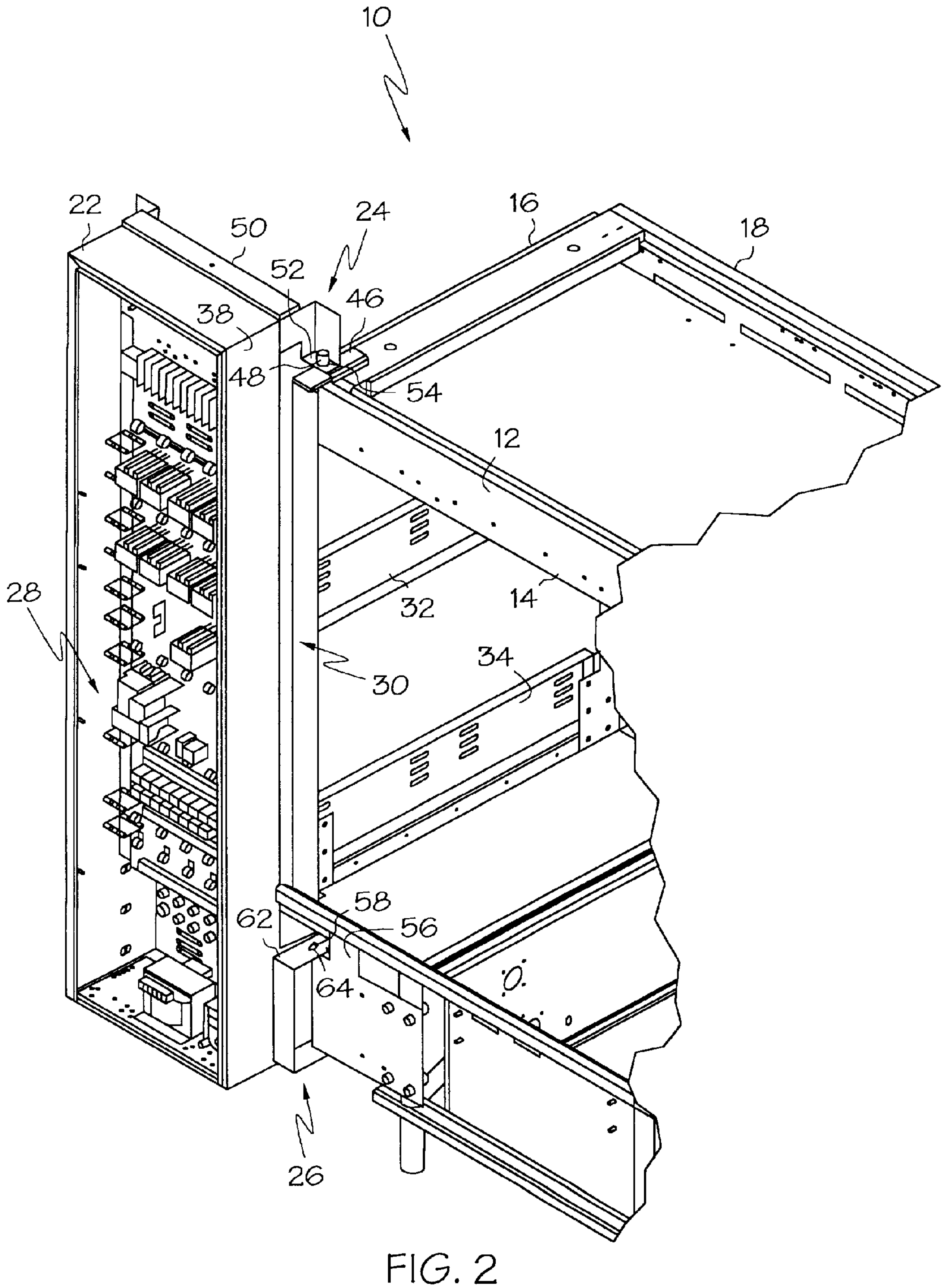
FIG. 2 is a perspective view of the warewasher section frame and control box assembly of FIG. 1, taken from front of the warewasher section, where the control box is positioned in its operating orientation.

Referring FIGS. 1 and 2, fasteners, such as studs 40 are preferably used to secure the control box 22 to the struts 32, 34 and the lateral end 16 of the frame 12. The struts 32, 34 are removably mounted to the frame using screws, and are intended to be removed after the warewasher section 10 is unloaded and the control box 22 is pivoted to the operating orientation.

Figure 6:
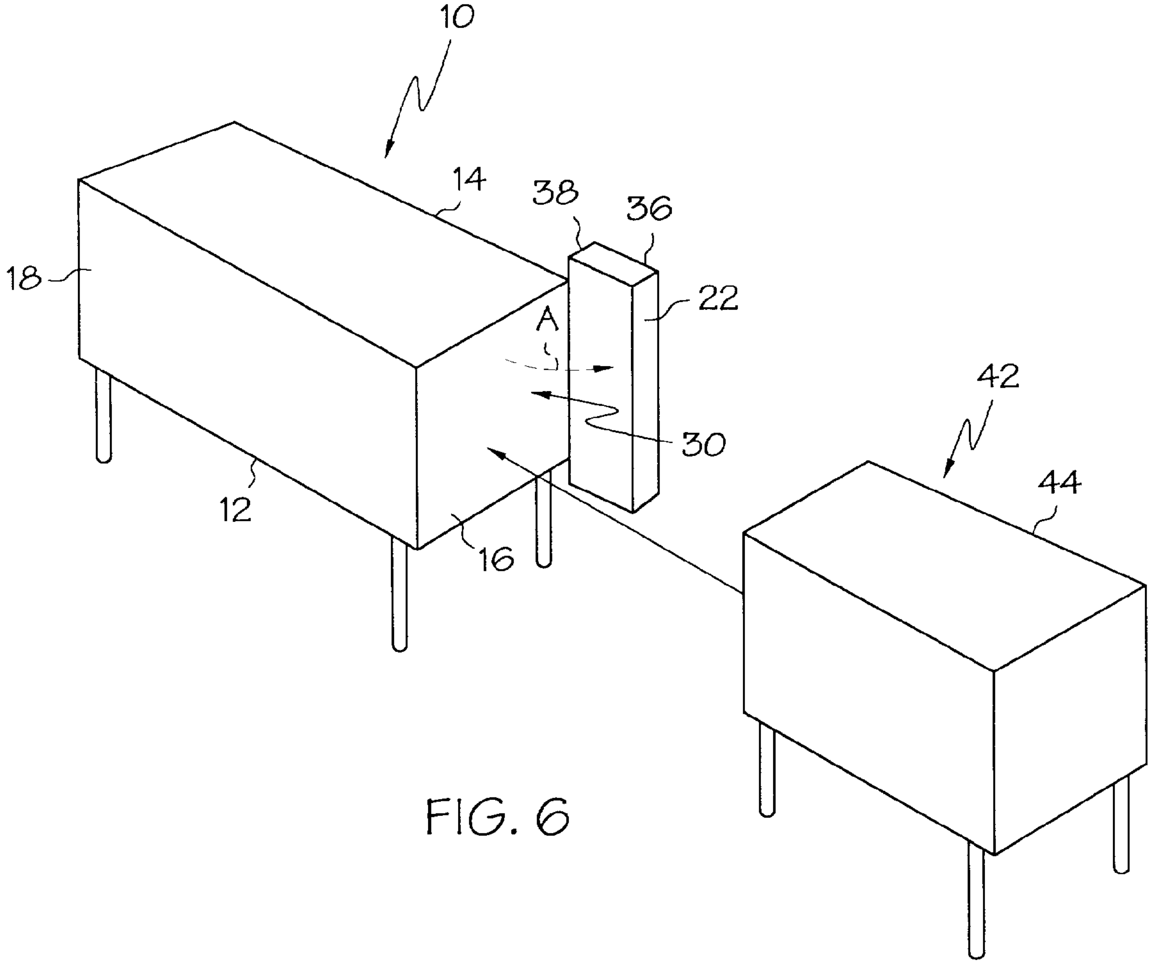
FIG. 6 is a simplified perspective diagram of the warewasher section and control box assembly being coupled to a second warewasher section end-to-end.

As shown in FIGS. 1, 2 and 6, in the operating orientation, the rear face 36 of the control box has been swung approximately 90° (as indicated by arrow A) away from the lateral end 16 of the frame 12. In this orientation, total lateral width of the warewasher is increased by the thickness of the control box 22. Once the control box is swung to the operating position, the struts 32, 34 are preferably removed, and a second warewasher section 42 can be coupled to the frame 12 of the first warewasher section 10. Once the warewasher is assembled, the control box 22 is located along the longitudinal front wall thereof, at the interface between the first warewasher section 10 and the second warewasher section 42. The studs 40 are thereafter received within complementary holes in the longitudinal front wall 44 of the second warewasher section, so as to fasten the control box 22 to the second warewasher section. In the illustrated embodiment, the second warewasher section is an unload section that may be connected to a main section.

Once the first and second warewasher sections are assembled together and the control box 22 is fastened to the second warewasher section 42, the upper hinge 24 and lower hinge 26 may be removed if desired. As shown in FIGS. 1–4, and specifically in FIG. 2, the upper hinge 24 includes upper mounting bracket 46 mounted to the top surface of the frame 12 and a hinge pin 48 extends upwardly therefrom. An upper connecting bracket 50 extends from the control box 22 and includes a horizontal plate segment 52 with bore 54 extending vertically therethrough for receiving the pin 48. As shown in FIGS. 1–4, and specifically in FIG. 1, the lower hinge 26 includes lower mounting bracket 56 extending from the bottom surface of the frame 12 and a hinge pin 58 extends upwardly therefrom. A lower connecting bracket 60 extends from the control box 22 and includes a horizontal plate segment 62 with a bore 64 extending therethrough for receiving the hinge pin 58. The mounting brackets 46, 56 and the connecting brackets 50, 60 are preferably mounted to the frame and control box using screws. Therefore, after the warewasher is assembled as described above, the mounting brackets 46, 56 and the connecting brackets 50, 60 may be easily removed. The components may then be recycled or reused.

While the forms of apparatus herein described constitute a preferred embodiment of the invention, it is to be understood that the present invention is not limited to these precise forms and that changes may be made therein without departing from the scope of the invention.

What is claimed is:

1. A method for assembling a warewasher assembly comprising steps of:

(a) providing a first warewasher section, the first warewasher section including a substantially box-like frame, having longitudinal front and rear walls, a lateral end and a front corner at an intersection of the front wall and the lateral end, and a control box, having a pair of opposing side faces, a front face, a rear face and a rear corner at an intersection of one of the side faces and the rear face, the rear corner of the control box being pivotally coupled approximate the front corner of the frame and pivotable from a shipping orientation, in which the rear face of the control box faces the lateral end of the frame, to an operating orientation, in which the rear face of the control box is substantially perpendicular to the lateral end of the frame;

(b) pivoting the control box from the shipping orientation to the operating orientation; and (c) coupling a second warewasher section to the lateral end of the frame of the first warewasher section.

2. The method of claim 1, wherein, prior to step (b), the method further comprises steps of:

(a1) mounting a support strut to the lateral end of the frame so that the support strut extends between the front and rear walls of the frame;

(a2) pivoting the control box in the shipping orientation;

(a3) fastening the rear face of the control box to at least one of the lateral end of the frame and the support strut;

(a4) transporting the first warewasher section to an assembly location.

3. The method of claim 2, further comprising a step of, after step (b), (b1) removing the support strut from the lateral end of the frame.

4. The method of claim 2, wherein the first warewasher section includes at least one of an electronically-controlled, electrical and mechanical component and the control box includes an electrical control for controlling the one electrical and mechanical component, and wherein the method includes a step of, prior to step (a4), (a0) pre-wiring the electrical control to the one electrical and mechanical component.

5. The method of claim 1, wherein the rear corner of the control box is pivotally coupled approximate the front corner of the frame by an upper hinge and a lower hinge and wherein, after step (c), the method further comprises a step of:

(c1) fastening the rear face of the control box to a front wall of the second warewasher section; and (c2) removing the upper and lower hinges from the first warewasher section.

* * * * *